United States Patent
Chaussade et al.

(10) Patent No.: US 6,787,204 B2
(45) Date of Patent: Sep. 7, 2004

(54) MULTIPLE GLAZED INSULATING UNIT, ESPECIALLY FOR AN AIRCRAFT WINDOW, WITH ELECTROMAGNETIC ARMOR

(75) Inventors: Pierre Chaussade, Orleans (FR); Xavier Drouet, Fosses (FR)

(73) Assignee: Saint-Gobain Glass France, Courbevoie (FR)

( * ) Notice: Subject to any disclaimer, the term of this patent is extended or adjusted under 35 U.S.C. 154(b) by 0 days.

(21) Appl. No.: 10/183,508

(22) Filed: Jun. 28, 2002

(65) Prior Publication Data

US 2003/0087048 A1 May 8, 2003

Related U.S. Application Data

(63) Continuation of application No. 09/926,410, filed as application No. PCT/FR00/01133 on Apr. 27, 2000, now abandoned.

(30) Foreign Application Priority Data

Apr. 28, 1999 (FR) .............................................. 99 05374

(51) Int. Cl.[7] .............................. E06B 3/24; E04C 2/54; H01K 9/00
(52) U.S. Cl. ..................... 428/34; 174/35 R; 52/786.13
(58) Field of Search .................. 428/34, 192; 52/786.1, 52/786.13; 174/35 R, 35 SM; 219/203, 543, 547; 244/121

(56) References Cited

U.S. PATENT DOCUMENTS

| | | | |
|---|---|---|---|
| 3,591,248 A | * | 7/1971 | Jumet et al. .................... 350/1 |
| 4,412,255 A | * | 10/1983 | Kuhlman et al. ........... 358/245 |
| 4,613,530 A | * | 9/1986 | Hood et al. .................... 428/34 |
| 4,874,903 A | * | 10/1989 | Clarke .................... 174/35 MS |
| 5,147,694 A | * | 9/1992 | Clarke .......................... 428/34 |
| 5,227,241 A | | 7/1993 | Chaussade et al. |
| 5,270,518 A | | 12/1993 | Naoumenko et al. |
| 5,306,547 A | * | 4/1994 | Hood et al. .................. 428/213 |
| 5,585,188 A | | 12/1996 | Cheron et al. |
| 5,650,208 A | | 7/1997 | Chaussade et al. |
| 5,677,065 A | | 10/1997 | Chaussade et al. |
| 5,763,089 A | | 6/1998 | Chaussade et al. |
| 5,766,755 A | | 6/1998 | Chaussade et al. |
| 5,800,918 A | | 9/1998 | Chartier et al. |

* cited by examiner

Primary Examiner—Donald J. Loney
(74) Attorney, Agent, or Firm—Oblon, Spivak, McClelland, Maier & Neustadt, P.C.

(57) ABSTRACT

A multiple glazed insulating unit, especially for an aircraft window, with electromagnetic armor. An insulating multiple glazing unit includes a glazed section provided with at least two superposed panes of mechanically-strong transparent substrate, between which is interposed at least one gap filled with gas. The panes are mounted at their periphery in a seal, by which the glazing unit can be built into a structure designed to enclose a space containing instruments susceptible to being disturbed by an electromagnetic field, and which has an electromagnetic shielding function. The glazed section is provided with at least one continuous electrically-conductive transparent thin layer, and the seal is made conductive at least in part to ensure connection of the electrically-conductive transparent thin layer to the structure. Conductivities of the electrically-conductive transparent thin layer and of the seal are chosen to ensure continuity of the electromagnetic shielding of the structure.

26 Claims, 2 Drawing Sheets

MULTIPLE GLAZED INSULATING UNIT, ESPECIALLY FOR AN AIRCRAFT WINDOW, WITH ELECTROMAGNETIC ARMOR

This application is a Continuation of application Ser. No. 09/926,410 Filed on Oct. 29, 2001, now abandoned which was filed as PCT/FR00/01133, filed Apr. 27, 2000.

BACKGROUND OF THE INVENTION

1. Field of the Invention

The present invention relates to insulating multiple glazing units with at least one gap filled with gas, particularly air, especially the windows of transportation vehicles, and more particularly the windows of aircraft.

2. Discussion of the Background

The fuselage of an aircraft constitutes a metal envelope that ensures an electromagnetic shielding function. Similarly, the windshield of an aircraft is metallized, for example by incorporation of a conductive and transparent layer used for deicing. In this way the aircraft instruments susceptible to disturbance by an electromagnetic field are insulated.

Nevertheless, the electromagnetic shielding of the fuselage contains "electromagnetic holes" in the form of the windows. In fact, the windows, which are generally formed from double glazing units of poly(methyl methacrylate) with an interposed air gap, do not ensure the function of electromagnetic shielding.

With the advent of mobile phones and portable computers that the passengers use during their aircraft trips, the need for ensuring continuity of the electromagnetic shielding of the aircraft has now arisen. These portable devices can actually cause disturbances, which interfere with communications between the flight crew and the control tower. For safety reasons, therefore, it is now becoming imperative to insulate the interior of aircraft completely by providing continuous electromagnetic shielding.

SUMMARY OF THE INVENTION

The present invention brings a solution to this problem. To this end, it is provided according to the present invention that at least one electrically conductive thin layer is incorporated in the actual glazed section of the windows and that the peripheral window seals are made conductive.

The first object of the present invention is therefore an insulating multiple glazing unit whose glazed section is provided with at least two superposed panes of mechanically strong transparent substrate, between which there is interposed at least one gap filled with gas, generally air, the said panes being mounted at their periphery in a seal, by means of which the said glazing unit can be built into a structure designed to enclose a space containing instruments susceptible to being disturbed by an electromagnetic field and which has an electromagnetic shielding function, characterized by the fact that the glazed section is provided with at least one continuous electrically conductive transparent thin layer, and in that the seal is made conductive at least in part in order to ensure connection of the said electrically conductive transparent thin layer or layers to the said structure, the conductivities of the said electrically conductive transparent thin layer or layers and of the said seal being chosen to ensure continuity of the electromagnetic shielding of the said structure.

In general, the panes of mechanically strong, transparent substrate are made of one-piece glass plates (soda lime glass) or of polymer plates, such as poly(methyl methacrylate) (PMMA) or of laminated glass plates of the type of those in which a sheet of polyvinylbutyral (PVB) or of polyurethane (PU) having a thickness of generally between 0.3 and 2 mm is sandwiched between two sheets of PMMA. Traditionally, these plates can be plane or curved or arched. The glazing units that are particularly preferred, because they are the most common, are the double glazing units.

Preferably, it is provided that the transparent electrically conductive thin layers applied according to the present invention are disposed in the interior of a multiple glazing unit, such that these layers are protected from mechanical impacts and scratching. Nevertheless, the electrically conductive layer can even be deposited on an exterior face of the glazing unit, particularly on the interior side of the aircraft, where "overglazing", also known as "decorative window treatment", is generally present and even permits a certain degree of protection of the layer.

According to a first embodiment of the present invention, at least one electrically conductive transparent thin layer is constituted by a layer of doped semiconductor or metal oxide, deposited by cathodic sputtering under vacuum, especially by magnetron, or by liquid-phase or gas-phase pyrolysis if the substrate is resistant to heat (inorganic glass) or by any other deposition technique (immersion, spraying, sol-gel, etc.), having a thickness of between 100 nm and 1000 nm and a surface resistivity of 2 to 40 $\Omega/\square$, particularly 15 to 30 $\Omega/\square$, a layer of doped semiconductor oxide being:

(a) either disposed to cover at least one face of a pane which is a component of this glazing unit, preferably a face turned toward the interior of the multiple glazing unit;
(b) or included in the body of a substrate pane;
(c) or even deposited on at least one face of a transparent thin film of poly(ethylene terephthalate) (PET) type, or of a thin glass plate, the said film or the said plate constituting an additional layer in the glazed section.

The doped semiconductor oxide constituting these transparent electrically conductive thin layers is in particular indium oxide doped with tin (ITO) or tin oxide doped with antimony or fluorine. ITO is particularly preferred.

As indicated hereinabove in point (a), the transparent electrically conductive thin layers are preferably deposited on substrate panes which are turned toward the interior of the insulating multiple glazing unit. Thus the double glazing units in which at least one internal face is covered by a layer of doped semiconductor oxide can be mentioned as particularly preferred.

To achieve version (b), according to which an electrically conductive thin layer is included in the body of a substrate pane, such a thin layer can be deposited on at least one face of a transparent PET film (F), and this film (F) can be used to form a laminated glass of PMMA/PVB or PU/(F)/PVB or PU/PMMA type.

In the case of version (c), it can be provided that the thin film—or the thin glass plate—is coated on one of its faces by the layer of semiconductor oxide and is applied, for example by adhesive, on one face of a pane which is a component of the multiple glazing unit. It can also be provided that such a film—or such a plate—coated on at least one of its faces, is clamped parallel to the panes, in an intermediate space filled with gas, means being provided to hold the film—or the plate—at its periphery in the seal; the seal can therefore be provided with an additional retaining groove for the film or the plate. The clamped film can also be applied against a pane and introduced together therewith into the corresponding groove of the seal.

The thin film of PET type that can be used in versions (b) or (c) has in particular a thickness on the order of 25 to 150 microns, especially from 50 to 125 microns. As regards the thin glass plate that can be used in version (c), it can have a thickness on the order of 0.5 to 2 mm, especially 0.5 mm to 1 mm.

According to a second embodiment of the present invention, at least one electrically conductive transparent thin layer is constituted by at least one metal layer M inserted between two layers of a dielectric transparent material D of high optical index, in such a way as to form a stack of DMD type or a stack formed by a combination of several base stacks, such as DMDMD, the stack being disposed so as to cover one face, preferably a face of a pane which is a component of the glazing unit, the face being turned toward the interior of the glazing unit.

In particular, the metal layer M is a layer of gold or silver, and the dielectric transparent material D of high optical index is tin dioxide or zinc sulfide.

The different layers constituting these stacks are deposited in well known manner by evaporation or by cathodic sputtering under vacuum. They each have a thickness on the order of 50 to 500 nanometers ($10^{-9}$ m).

In general, the double glazing units in which at least one of the faces, preferably an internal face, is coated by a DMD or DMDMD stack such as just defined can be mentioned as particularly preferred.

As already indicated, the layers can be on an external face of the glazing unit and in particular on the interior face in the aircraft, especially when a "decorative window treatment" is present.

Also, when one of the panes constituting the multiple glazing unit of the window is a laminate, the layers can be disposed in the body of the pane, applied on one of the internal faces of one of the constituents of the laminate: on one of the sheets of glass and/or even on a film, especially PET, integrated into the laminate.

According to the present invention, the seal in which the actual glazed section of the insulating multiple glazing unit is mounted is made from an elastomer which advantageously comprises a silicone or fluorosilicone that has been made conductive at least in part by incorporation into its composition of an electrically conductive filler formed from metal granules or fibers, especially of silver, copper, aluminum, nickel, silver/copper, silver/aluminum, silver/glass, etc., or from carbon black, the conductive elastomer having in particular a volume resistivity of $2 \times 10^{-5}$ to $2 \times 10^{-3}$ ohm·m (0.002 to 0.1 ohm·cm), the electrically conductive thin layer or layers being in contact with a conductive part of the seal, which is also designed to make contact with the structure to be provided with electromagnetic shielding.

It is self-evident that the base elastomer from which the seal is made has all the properties required for the application under consideration: Shore hardness A, tearing strength, permanent compressive deformation, elongation at break, etc., and that the incorporation of the conductive filler has not substantially modified these properties. In particular, the Shore hardness A of the seal is advantageously from 30 to 80.

According to a particularly advantageous first modified embodiment, the seal is produced from elastomer made conductive throughout its composition.

According to another version, the seal is made by comolding of two elastomers, one of which is the conductive elastomer of the invention and is disposed so as to cooperate with the electrically conductive thin layer or layers of the invention. It will be advantageously provided that the conductive part of the seal is the internal part, which can be more easily made to cooperate with the overall structure to be provided with electromagnetic shielding.

Moreover, if the conduction of the seal proves to be insufficient, it is possible according to the present invention to provide for endowing the seal with a conductivity boost, comprising in particular:

a conductive film, for example of tinned Cu, or a metal mesh or a conductive paint, for example an Ag lacquer, applied on at least one part of the seal surface; and/or a metal hoop or metal foil or metal mesh or adhesive metal tape placed at the periphery of the glazing unit or at points or regions of the periphery, against at least one internal part of the seal, in such a way as to make contact with an electromagnetic thin layer and/or with the structure to be provided with electromagnetic shielding; and/or a conductive enamel or a conductive paste deposited on a conductive thin layer and making contact with the seal or, as the case may be, with a metal hoop or foil or tape at the periphery of the glazing unit or at points or regions of the periphery.

In a particularly preferred embodiment, the insulating multiple glazing unit of the present invention comprises an aircraft window provided with electromagnetic shielding with a rating of at least 10 db, particularly 10 db to 30 db.

BRIEF DESCRIPTION OF THE DRAWING

For better illustration of the object of the present invention, several embodiments that are not to be construed as limitative will be described hereinafter by way of indication and with reference to the attached drawing.

On this drawing.

DESCRIPTION OF THE PREFERRED EMBODIMENTS

Figure 1:
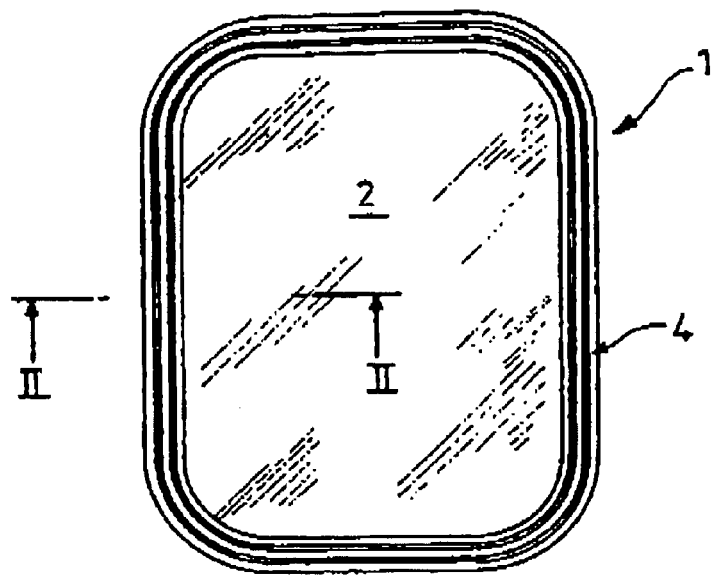
FIG. 1 is a front view of the outside of a window.
Figure 2:
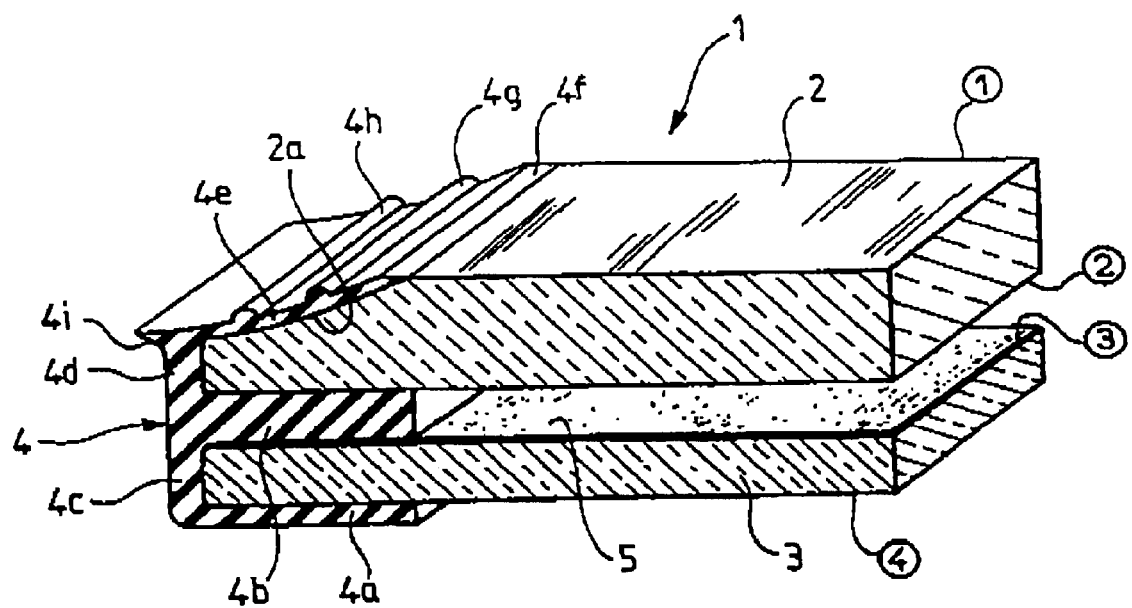
FIGS. 2 to 4 each represent, on a larger scale, perspective views of the cross section through II—II of FIG. 1, according to a particular embodiment of the electromagnetic shielding.

Referring to FIGS. 1 and 2, it can be seen that an aircraft window having the general form of a rectangle with rounded corners has been represented as a whole by 1.

As is traditional, window 1 is provided with two panes (2, 3) of drawn poly(methyl methacrylate), which are disposed in facing relationship with a distance therebetween and are held by a peripheral seal 4 of elastomer, by which the window is designed to be built into the metal fuselage of the aircraft.

Exterior pane 2 has the form of a relatively thick plate, whose peripheral border 2a is chamfered. Interior pane 3 is made of thinner plate than pane 2. Moreover, both panes 2 and 3 have the classical curved shape, such that they are inwardly concave.

A window of this type is that sold for the A320 aircraft. It has the form of a rectangle of 380 mm in height and 280 mm in width, with a radius of curvature at the corners of about 3000 mm. The thickness of exterior pane 2 is 9 mm and that of the interior pane is 4 mm. Air-filled gap 5 separating the two panes 2 and 3 has a thickness of 5 mm.

Peripheral seal 4 has a generally U-shaped profile with two branches 4a and 4b which are parallel to one another and are joined by a base 4c, branches 4a and 4b and base c defining in the interior a peripheral groove in which the border of interior pane 3 is received sealingly. In addition, base 4c has an extension 4d on the side of branch 4b, and then is bent over to form an exterior branch 4e situated facing center branch 4b but inclined toward the exterior. Branches 4b and 4e, together with extension 4d, define a second groove designed to receive the peripheral border of exterior pane 2 sealingly, inclined branch 4e being applied against chamfered exterior border 2a of pane 2.

Central branch 4b has a thickness corresponding to the desired spacing between panes 2 and 3.

Exterior branch 4e has a free border 4f which is chamfered such that, in assembled position, it is situated in the extension of the external face of pane 2. In addition, it is provided on the exterior with two peripheral beads 4g and 4h and, opposite base 4d, is extended by a lip 4i, the function of beads 4g and 4h and of lip 4i being to ensure airtightness.

In traditional manner, the different faces of the double glazing unit of this design are numbered from (1) to (4) from the exterior to the interior of the aircraft. Also, pane 3 is provided with a small orifice (not shown) close to seal 4, to ensure that the pressurization of the aircraft is applied on external pane 2.

Window 1 as just described has the feature that it is provided with electromagnetic shielding designed to ensure continuity of the electromagnetic shielding of the aircraft fuselage. This electromagnetic shielding is achieved on the one hand by a transparent electrically conductive thin layer 5 of ITO, deposited over the entirety of a face of panes 2, 3 in a thickness on the order of 400 nm and having a surface conductivity of 15 $\Omega/\square$, and on the other hand by the fact that seal 4 is chosen to be a conductive elastomer having the characteristics indicated hereinabove in the introduction of the present description. Layer 5 and seal 4 are in contact over the entire periphery via one of the lateral faces of branch 4b.

Although layer 5 can be deposited equally well on any one of faces (1) to (4), it is preferably deposited on an internal face, and more preferably on face (3), because pane 3 has a simpler shape and is easier to manufacture than pane 2, and it can be provided more easily with the connection to the aircraft structure to achieve electromagnetic shielding.

In addition, it would be possible to produce the seal in two parts, separated at the plane through the middle of central branch 4b, for example, the external part being of nonconductive elastomer and only the internal part that cooperates with layer 5 having been made conductive.

Figure 3:
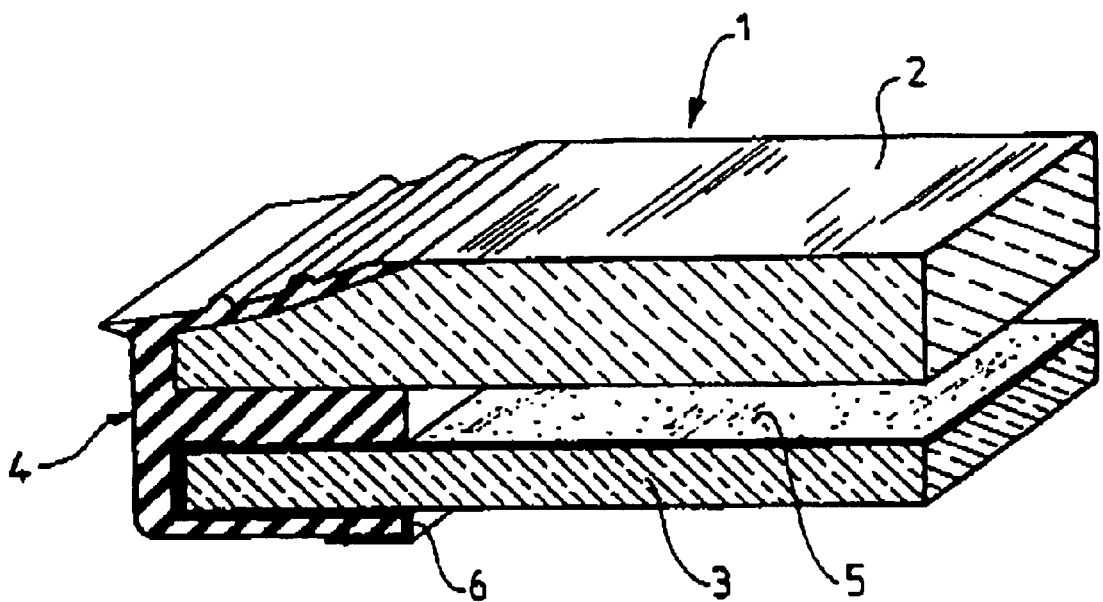

Referring now to FIG. 3, it is evident that it shows a window version identical to that of FIG. 2 (like reference numbers having been used to denote like elements), except that the conduction has been boosted by the interposition of a plurality of metal foils 6, for example of tinned copper, disposed between branch 4a of seal 4 and pane 3, and extended on one side so as to surround the border of pane 3 and on the other side so as to surround the free border of branch 4a. Metal foils 6, of which there can be eight, for example, are distributed regularly around the periphery of pane 3.

These metal foils 6 can be replaced by metal tapes, for example of copper, aluminum or tinned copper, backed by a highly conductive pressure-sensitive adhesive applied to pane 3, the said adhesive containing a dispersion of oxidation-resistant conductive particles, which create very low electrical resistance across the tape.

Figure 4:
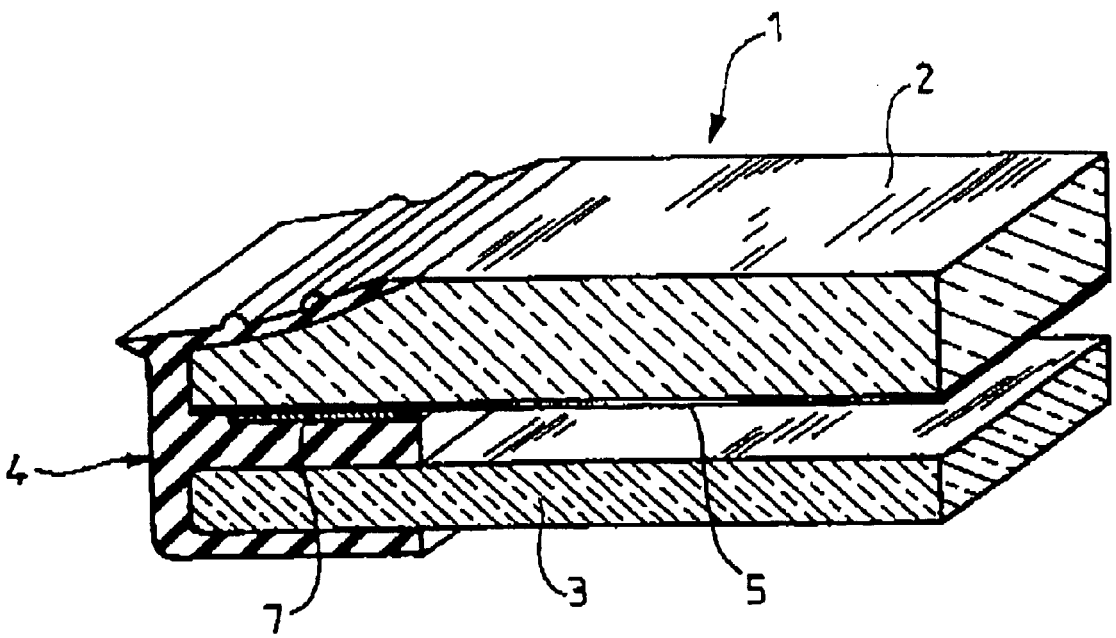

The version represented in FIG. 4 differs from the foregoing versions by the fact that electrically conductive thin layer 5 of ITO is applied on pane 2 and in that the conduction between thin layer 5 and seal 4 is boosted in this case by deposition, close to the periphery of pane 2, on layer 5, of a silver paste 7 which, when the glazed section is in its position mounted in seal 4, is situated against the opposite face of central branch 4b, for example from the edge thereof as far as the vicinity of base 4c. This silver paste 7 is composed, for example, of organic resin filled with silver, and it is applied on thin layer 5 by a screen-printing technique.

If pane 2 were to be made of glass, silver paste 7 would be replaced by a silver-base enamel, which is produced, for example, from glass frit filled with silver and applied by a screen-printing technique.

It is understood, of course, that the embodiments described in the foregoing have been presented by way of indication and are not to be construed as limitative, and that modifications can be made without departing from the scope of the present invention.

What is claimed is:

1. An insulating multiple glazing unit comprising:
at least two superposed panes of transparent substrate, between which there is interposed at least one gap filled with gas;
a seal configured to mount said panes at their periphery by which the glazing unit can be built into a structure configured to enclose a space containing instruments susceptible to being disturbed by an electromagnetic field and which has an electromagnetic shielding function;
at least one continuous electrically conductive transparent thin layer provided on one of the panes, and
wherein the seal is formed of a central branch and first and second side branches, the central branch and the first side branch defining a first groove to sealingly receive a first of the two panes, the central branch and the second side branch defining a second groove to sealingly receive a second of the two panes, and wherein the seal is made conductive at least in part to ensure connection of the at least one continuous electrically conductive transparent thin layer to the structure, conductivities of the electrically conductive transparent thin layer and of the seal chosen to ensure continuity of the electromagnetic shielding of the structure,
wherein the at least one electrically conductive transparent thin layer is constituted by a layer of doped semiconductor, having a thickness between 100 nm and 1000 nm and a surface resistivity of 2 to 40 $\Omega/\square$, the layer of doped semiconductor oxide being disposed to cover at least one face of the panes.

2. A glazing unit according to claim 1, wherein the surface resistivity of the at least one electrically conductive transparent thin layer is 15 to 30 $\Omega/\square$.

3. A glazing unit according to claim 1, wherein the layer of doped semiconductor oxide is included in a body of one of the at least two panes.

4. A glazing unit according to claim 1, wherein the layer of doped semiconductor oxide is deposited on at least one face of a transparent thin body of poly(ethylene or terephthalate) integrated as an additional layer in the glazed section.

5. A glazing unit according to claim 1, wherein the layer of doped semiconductor oxide is deposited on a thin glass plate integrated as an additional layer in the glazed section.

6. A glazing unit according to claim 1, wherein the panes of transparent substrate are made of one of one-piece glass plates, of polymer plates, or laminated plates.

7. A glazing unit according to claim 1, wherein the electrically conductive thin layer is disposed in an interior of the at least two superposed panes.

8. A glazing unit according to claim 3, wherein the semiconductor oxide is one of indium oxide doped with tin (ITO) or tin oxide doped with antimony or fluorine.

9. A glazing unit according to claim 3, wherein the seal is made from an elastomer that comprises a silicone or fluorosilicone that is conductive at least in part by including in its composition an electrically conductive filler formed from metal granules or fibers, the conductive elastomer having a volume resistivity of $2 \times 10^{-5}$ to $2 \times 10^{-3}$ ohm·m (0.002 to 0.1 ohm·cm), the at least one continuous electrically conductive thin layer being in contact with a conductive part of the seal, which is configured to make contact with the structure to be provided with electromagnetic shielding.

10. A glazing unit according to claim 5, wherein the elastomer has a Shore hardness A of 30 to 80.

11. A glazing unit according to claim 5, wherein the seal is an elastomer made conductive throughout its composition.

12. A glazing unit according to claim 5, wherein the seal is made by comolding of first and second elastomers, the first elastomer being conductive and disposed to cooperate with the at least one continuous electrically conductive thin layer.

13. A glazing unit according to claim 5, further comprising a conductivity boost comprising:
one of a conductive film, a conductive layer, or a conductive paint on at least one part of a surface of the seal.

14. A glazing unit according to claim 9, further comprising:
one of a metal hoop, a metal foil, or an adhesive metal tape placed at a periphery of the glazing unit or at points or regions of the periphery, against at least one internal part of the seal, to make contact with the at least one continuous electromagnetic thin layer.

15. A glazing unit according to claim 10, further comprising:
one of a conductive enamel or a conductive paste deposited on a conductive thin layer and making contact with the seal or with the one of the metal hoop, the metal foil, or the adhesive metal tape at a periphery of the glazing unit.

16. A glazing unit according to claim 1, comprising an aircraft window provided with electromagnetic shielding with a rating of at least 10 db.

17. An insulating multiple glazing unit comprising:
at least two superposed panes of transparent substrate, between which there is interposed at least one gap filled with gas;
a seal configured to mount said panes at their periphery by which the glazing unit can be built into a structure configured to enclose a space containing instruments susceptible to being disturbed by an electromagnetic field and which has an electromagnetic shielding function;
at least one continuous electrically conductive transparent thin layer provided on one of the panes,
wherein the seal is made conductive at least in part to ensure connection of the at least one continuous electrically conductive transparent thin layer to the structure, conductivities of the electrically conductive transparent thin layer and of the seal chosen to ensure continuity of the electromagnetic shielding of the structure,
wherein the at least one electrically conductive transparent thin layer is constituted by a layer of doped semiconductor, having a thickness between 100 nm and 1000 nm and a surface resistivity of 2 to 40 $\Omega/\square$, the layer of doped semiconductor oxide being disposed to cover at least one face of the panes, and
wherein the layer of doped semiconductor oxide is deposited on at least one face of a transparent thin body of poly(ethylene or terephthalate) integrated as an additional layer in the glazed section.

18. An insulating multiple glazing unit comprising:
at least two superposed panes of transparent substrate, between which there is interposed at least one gap filled with gas;
a seal configured to mount said panes at their periphery by which the glazing unit can be built into a structure configured to enclose a space containing instruments susceptible to being disturbed by an electromagnetic field and which has an electromagnetic shielding function;
at least one continuous electrically conductive transparent thin layer provided on one of the panes,
wherein the seal is made conductive at least in part to ensure connection of the at least one continuous electrically conductive transparent thin layer to the structure, conductivities of the electrically conductive transparent thin layer and of the seal chosen to ensure continuity of the electromagnetic shielding of the structure,
wherein the at least one electrically conductive transparent thin layer is constituted by a layer of doped semiconductor, having a thickness between 100 nm and 1000 nm and a surface resistivity of 2 to 40 $\Omega/\square$, the layer of doped semiconductor oxide being disposed to cover at least one face of the panes, and
wherein the layer of doped semiconductor oxide is deposited on a thin glass plate integrated as an additional layer in the glazed section.

19. A glazing unit according to claim 18, wherein the elastomer has a Shore hardness A of 30 to 80.

20. A glazing unit according to claim 18, wherein the seal is an elastomer made conductive throughout its composition.

21. A glazing unit according to claim 18, wherein the seal is made by comolding of first and second elastomers, the first elastomer being conductive and disposed to cooperate with the at least one continuous electrically conductive thin layer.

22. A glazing unit according to claim 18, further comprising a conductivity boost comprising:
one of a conductive film, a conductive layer, or a conductive paint on at least one part of a surface of the seal.

23. A glazing unit according to claim 19, further comprising:
one of a conductive enamel or a conductive paste deposited on a conductive thin layer and making contact with the seal or with the one of the metal hoop, the metal foil, or the adhesive metal tape at a periphery of the glazing unit.

24. An insulating multiple glazing unit comprising:
at least two superposed panes of transparent substrate, between which there is interposed at least one gap filled with gas;
a seal configured to mount said panes at their periphery by which the glazing unit can be built into a structure configured to enclose a space containing instruments susceptible to being disturbed by an electromagnetic field and which has an electromagnetic shielding function;

at least one continuous electrically conductive transparent thin layer provided on one of the panes, wherein the seal is made conductive at least in part to ensure connection of the at least one continuous electrically conductive transparent thin layer to the structure, conductivities of the electrically conductive transparent thin layer and of the seal chosen to ensure continuity of the electromagnetic shielding of the structure, wherein the at least one electrically conductive transparent thin layer is constituted by a layer of doped semiconductor, having a thickness between 100 nm and 1000 nm and a surface resistivity of 2 to 40 $\Omega/\square$, the layer of doped semiconductor oxide being disposed to cover at least one face of the panes, and wherein the electrically conductive thin layer is disposed in an interior of the at least two superposed panes.

25. An insulating multiple glazing unit comprising:

at least two superposed panes of transparent substrate, between which there is interposed at least one gap filled with gas;

a seal configured to mount said panes at their periphery by which the glazing unit can be built into a structure configured to enclose a space containing instruments susceptible to being disturbed by an electromagnetic field and which has an electromagnetic shielding function;

at least one continuous electrically conductive transparent thin layer provided on one of the panes, wherein the seal is made conductive at least in part to ensure connection of the at least one continuous electrically conductive transparent thin layer to the structure, conductivities of the electrically conductive transparent thin layer and of the seal chosen to ensure continuity of the electromagnetic shielding of the structure, wherein the at least one electrically conductive transparent thin layer is constituted by a layer of doped semiconductor, having a thickness between 100 nm and 1000 nm and a surface resistivity of 2 to 40 $\Omega/\square$, the layer of doped semiconductor oxide being disposed to cover at least one face of the panes, wherein the layer of doped semiconductor oxide is included in a body of one of the at least two panes, and wherein the seal is made from an elastomer that comprises a silicone or fluorosilicone that is conductive at least in part by including in its composition an electrically conductive filler formed from metal granules or fibers, the conductive elastomer having a volume resistivity of $2 \times 10^{-5}$ to $2 \times 10^{-3}$ ohm·m (0.002 to 0.1 ohm·cm), the at least one continuous electrically conductive thin layer being in contact with a conductive part of the seal, which is configured to make contact with the structure to be provided with electromagnetic shielding.

26. A glazing unit according to claim 25, further comprising:

one of a metal hoop, a metal foil, or an adhesive metal tape placed at a periphery of the glazing unit or at points or regions of the periphery, against at least one internal part of the seal, to make contact with the at least one continuous electromagnetic thin layer.

* * * * *